(12) United States Patent
Sato

(10) Patent No.: US 6,389,524 B1
(45) Date of Patent: May 14, 2002

(54) DECODING DEVICE WITH ASSOCIATIVE MEMORY PERMITTING VARIABLE-LENGTH KEYWORD COMPARISONS

(75) Inventor: Hisakazu Sato, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 104 days.

(21) Appl. No.: 09/621,531

(22) Filed: Jul. 21, 2000

(30) Foreign Application Priority Data

Dec. 27, 1999 (JP) .......................................... 11-369606

(51) Int. Cl.⁷ .............................................. G06F 12/04
(52) U.S. Cl. .................. 711/212; 711/128; 365/189.07; 365/49
(58) Field of Search .............................. 365/49, 189.07; 710/65, 66, 127; 711/128, 212

(56) References Cited

U.S. PATENT DOCUMENTS

| | | | | |
|---|---|---|---|---|
| 5,502,832 A | * | 3/1996 | Ali-Yahia et al. | 365/49 |
| 5,526,504 A | * | 6/1996 | Hsu et al. | 711/207 |
| 5,625,787 A | * | 4/1997 | Mahin et al. | 712/204 |
| 5,717,885 A | * | 2/1998 | Kumar et al. | 711/207 |
| 5,956,756 A | * | 9/1999 | Khalidi et al. | 711/207 |
| 6,014,732 A | * | 1/2000 | Naffziger | 711/118 |
| 6,125,441 A | * | 9/2000 | Green | 712/204 |
| 6,157,980 A | * | 12/2000 | Arimilli et al. | 711/128 |
| 6,205,530 B1 | * | 3/2001 | Kang | 711/202 |

FOREIGN PATENT DOCUMENTS

| | | |
|---|---|---|
| JP | 7-22963 | 1/1995 |
| JP | 10-50076 | 2/1998 |

* cited by examiner

*Primary Examiner*—B. James Peikari
(74) *Attorney, Agent, or Firm*—McDermott, Will & Emery

(57) ABSTRACT

A tag array retains a plurality of tag data, and performs matching of the tag data with a retrieval keyword. The tag array includes matching circuits provided corresponding to the tag data. Each of the matching circuits has CM and CC cells provided corresponding to a plurality of bits of the corresponding tag data. Each CM cell retains a corresponding bit of the tag data, and performs matching of the retaining bit with a corresponding bit of the retrieval keyword. Each CC cell, not only functions as the CM cell, but also retains a comparison condition signal input in advance, and invalidates, according to the comparison condition signal, the mismatch detected between corresponding bits of the tag data and the retrieval keyword. As a result, it becomes possible to variably set the number of bits, of an input retrieval keyword, being matched with the tag data.

19 Claims, 8 Drawing Sheets

FIG. 9

| DATA BEFORE CODING | VARIABLE-LENGTH CODE |
|---|---|
| 0 | 0 |
| 1 | 10 |
| 2 | 1100 |
| 3 | 1101 |
| 4 | 1110 |
| 5 | 111100 |
| 6 | 111101 |
| 7 | 111110 |

FIG. 10

| WRITE ADDRESS | WRITE TAG | | | WRITE DATA | |
|---|---|---|---|---|---|
| | KL0 | KL1~KL8 | CL2~CL8 | DECODED DATA | CODE LENGTH |
| 0 | 1 | 0???_???? | 000_0000 | 0 | 1 |
| 1 | 1 | 10??_???? | 100_0000 | 1 | 2 |
| 2 | 1 | 1100_???? | 111_0000 | 2 | 4 |
| 3 | 1 | 1101_???? | 111_0000 | 3 | 4 |
| 4 | 1 | 1110_???? | 111_0000 | 4 | 4 |
| 5 | 1 | 1111_00?? | 111_1100 | 5 | 6 |
| 6 | 1 | 1111_01?? | 111_1100 | 6 | 6 |
| 7 | 1 | 1111_10?? | 111_1100 | 7 | 6 |
| 8~F | 0 | ????_???? | ???_???? | ? | ? |

| NUMBER OF RETRIEVAL | RETRIEVAL KEYWORD | DECODED DATA | CODE LENGTH |
|---|---|---|---|
| 1 | 1_1101_0010 | 3 | 4 |
| 2 | 1_0010_1111 | 0 | 1 |
| 3 | 1_0101_1111 | 0 | 1 |
| 4 | 1_1011_1111 | 1 | 2 |
| 5 | 1_1111_1111 | — | — |

DECODING DEVICE WITH ASSOCIATIVE MEMORY PERMITTING VARIABLE-LENGTH KEYWORD COMPARISONS

BACKGROUND OF THE INVENTION

1. Field of the Invention

The present invention relates to associative memory devices outputting stored data in response to comparison results between input retrieval data and the stored data, and more particularly, to an associative memory device which can change at a software level the length of data being compared, and a variable length code decoding device utilizing the same associative memory device.

2. Description of the Background Art

An associative memory device is known as a memory device which retrieves data having a tag that matches a specific keyword. Such an associative memory device is disclosed, for example, in Japanese Laid-Open Patent No. 10-50076. The associative memory device is configured to compare a part (hereinafter, referred to as a "tag" or a "tag portion") of data stored within the device with an input keyword, and to automatically read out data having the tag portion that matches the keyword.

In a conventional associative memory device, however, the data length of the tag portion, or the length of a keyword being compared, has been fixed normally at a hardware level. On the other hand, for data coded employing a variable length coding system, for example, the length of the keyword for comparison cannot necessarily be fixed. Therefore, it is usually difficult to process such data with the associative memory device.

Here, assume that a tag that should be compared is shorter than a data length predetermined at the hardware level, and all the tags stored have the same data length. In such a case, it is possible to fill up every remaining bit of the tag with a specific value and to fix a corresponding bit of the retrieval keyword to the same value, so that a proper retrieval can be conducted.

However, such an approach cannot be utilized for decoding of the variable length code data, because, in the variable length code data, the tag portions to be compared have various data lengths, and the data lengths of the tags cannot be determined before decoding.

Another approach is to modify a data storing method of the associative memory such that a proper retrieval can be conducted whatever value is included in a bit being unused as a tag. For example, assume that an associative memory device having a tag length of 8 bits, which is determined at a hardware level, is being used for retrieval of data having a tag of 6 bits. In such a case, data are stored such that the retrieval can be done without failure whatever values are contained in the remaining 2 bits of the retrieval keyword.

Specifically, a tag originally having 6 bits therein is extended for 2 bits by adding data of "00", "01", "10" and "11", respectively, so that four tags with 8 bits each are created based on the one tag with 6 bits. These four tags created are then made to correspond to the same data. In this manner, it becomes possible to conduct proper retrieval even with retrieval data having a length that is shorter than the data length of the tag predetermined at the hardware level.

In such a case, however, it is necessary to create a plurality of (4, in the above-mentioned case) entries with respect to one code. This poses a problem that data storage efficiency is considerably degraded.

SUMMARY OF THE INVENTION

An object of the present invention is to provide an associative memory device which is capable of changing the length of a keyword being compared at a software level and also applicable to decoding of a variable-length code efficiently, and to provide a variable-length code decoding device utilizing the same associative memory device.

In summary, the present invention is directed to an associative memory device outputting data according to an input of retrieval data having a plurality of bits, which includes a keyword comparison array and a data storage array.

The keyword comparison array retains a plurality of tag data each having a plurality of bits, and performs matching between the retrieval data input and each of the plurality of tag data. The keyword comparison array includes a plurality of matching circuits provided corresponding to the plurality of tag data, each comparing the retrieval data and corresponding one of the plurality of tag data. Each of the plurality of matching circuits includes: an n number (n is an integer at least 0) of first comparison memory units provided corresponding to n bits of the corresponding tag data, each retaining corresponding one bit and performing a matching operation between the retaining bit and a corresponding bit of the retrieval data; and an m number (m is a natural number) of second comparison memory units provided corresponding to respective parts of remaining bits of the corresponding tag data other than the n bits, each performing the matching operation between corresponding one part of the remaining bits and a corresponding bit of the retrieval data, a matching result of which is invalidated dependent on an externally set comparison condition signal. The keyword comparison array further includes a plurality of matching detection signal lines provided corresponding to the plurality of matching circuits. Each of the plurality of matching detection signal lines has a potential level that is determined according to the matching results of the n number of first comparison memory units and of an (m−k) number (k is an integer from 0 to m) among the m number of second comparison memory units other than the k number thereof having the comparison results invalidated, included in the corresponding matching circuit.

The data storage array responds to the potential level of each of the plurality of matching detection signal lines and outputs data corresponding to one of the plurality of tag data that matches the retrieval data.

Another aspect of the present invention is directed to a variable-length code decoding device for decoding variable-length code data, which includes a retrieval data setting circuit, an associative memory circuit, and a decoding target pointer circuit.

The retrieval data setting circuit receives a bit stream of the variable-length code data input as a decoding target, and outputs retrieval data including a fixed number of bits being decoded in one decoding process.

The associative memory circuit responds to input of the retrieval data, and outputs decoded data corresponding to the variable-length code data and code length data indicating the number of bits of the decoded data. The associative memory circuit includes: a keyword comparison array which retains coded variable-length code data as a plurality of tag data, and performs matching between the retrieval data input and each of the plurality of tag data. The keyword comparison array includes a plurality of matching circuits provided corresponding to the plurality of tag data, each comparing the retrieval data and corresponding one of the plurality of tag data. Each of the plurality of matching circuits has an m number (m is a natural number) of first comparison memory units provided corresponding to respective parts of bits of the corresponding tag data. Each of the first comparison memory units retains corresponding one part of bits and a comparison condition signal externally supplied in advance, and performs a matching operation between the part of bits and a corresponding bit of the retrieval data, a matching result of which is invalidated dependent on the comparison condition signal. The keyword comparison array further includes a plurality of matching detection signal lines provided corresponding to the plurality of matching circuits. Each of the plurality of matching detection signal lines has a potential level that is determined according to the matching results of an (m−k) number (k is an integer from 0 to m) among the m number of the first comparison memory units other than the k number thereof having the matching results invalidated, included in the corresponding matching circuit.

The associative memory circuit further includes a data storage array which, in response to the potential level of each of the plurality of matching detection signal lines, outputs the decoded data and the code length data associated with the variable-length code data corresponding to one of the plurality of tag data.

The decoding target pointer circuit refers to the code-length data and designates to the retrieval data setting circuit a leading bit of the fixed number of bits, out of the bit stream of the variable-length code data input, to be decoded in a next decoding process.

Thus, a primary advantage of the present invention is that it is possible to invalidate, upon matching of each bit between the retrieval data and each tag data, a matching result according to a comparison condition signal in a bit corresponding to the second comparison memory unit. Therefore, it becomes possible to provide an associative memory device that is capable of arbitrarily setting the number of bits being matched between the retrieval data and each tag data, at a software level.

Further, decoding of variable-length code data is performed utilizing an associative memory circuit that is capable of invalidating, upon the matching of each bit between the retrieval data and each tag data, a matching result according to a comparison condition signal in a bit corresponding to the second comparison memory unit. As a result, it becomes possible to efficiently perform the decoding of the variable-length code by arbitrarily setting the number of bits being matched between the retrieval data and each tag data, at a software level.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 9 illustrates an example of a variable length coding system.

FIG. 10 illustrates data stored in associative memory device 100 for a decoding based on the variable length coding system of FIG. 9.

DESCRIPTION OF THE PREFERRED EMBODIMENTS

Figure 1:
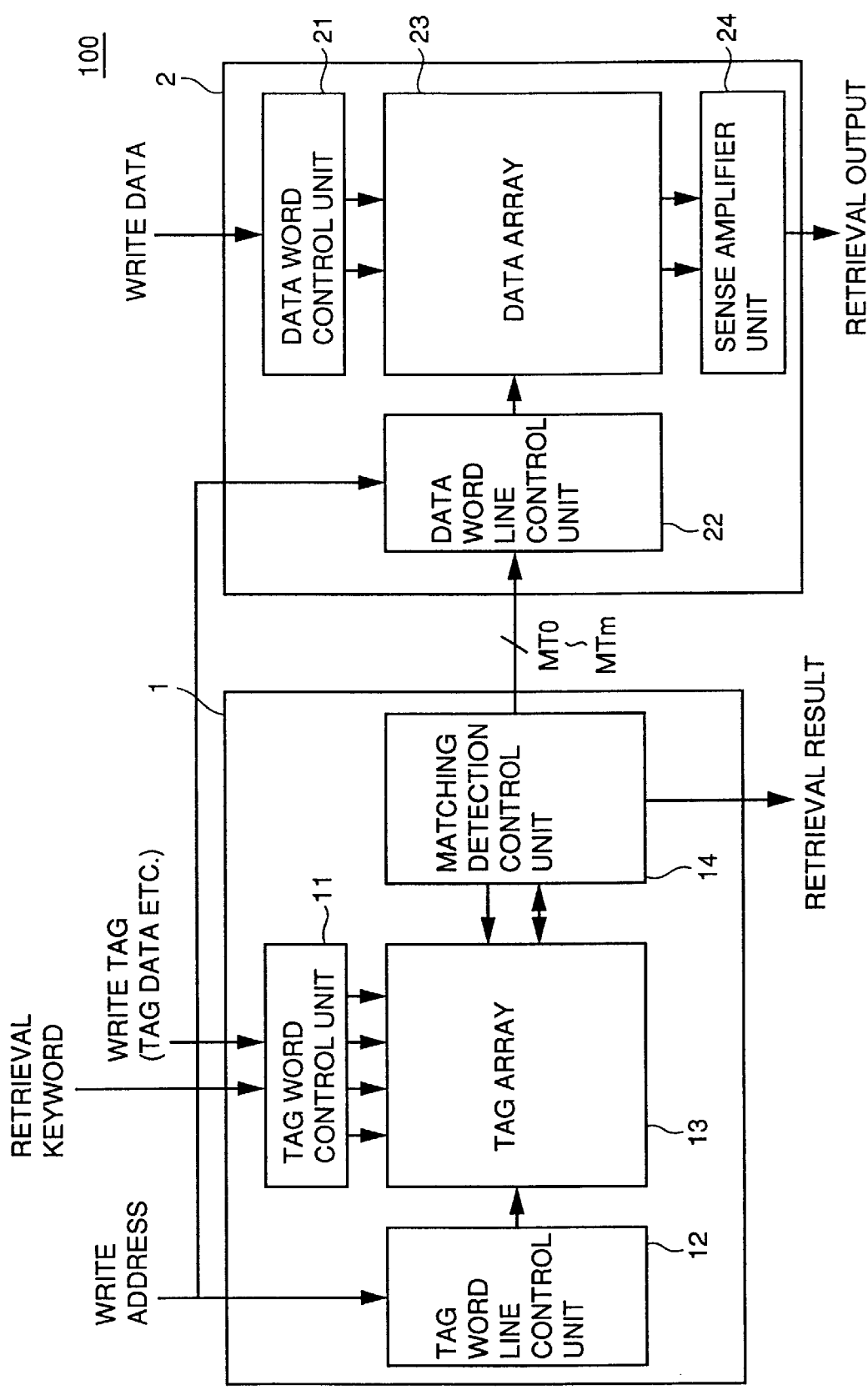
FIG. 1 is a schematic block diagram showing an entire configuration of an associative memory device 100 according to a first embodiment of the present invention.

Hereinafter, embodiments of the present invention will be described in detail with reference to the drawings, in which the same reference characters denote the same or corresponding portions.

First Embodiment

Referring to FIG. 1, associative memory device 100 includes: a keyword comparison unit 1 that stores data (hereinafter, also referred to "tag data") of a tag portion therein to perform matching between the tag data and an externally input retrieval keyword; and a data storage unit 2 that reads out data stored therein according to the comparison result of keyword comparison unit 1.

Keyword comparison unit 1 retains a plurality of tag data externally input. Keyword comparison unit 1 includes: a tag array 13 that performs the comparison operation between the retrieval keyword and each tag data; a tag word line control unit 12 that activates, in response to a write address externally input at the time of data writing operation, a corresponding region within tag array 13; a tag word control unit 11 that provides tag array 13 with the retrieval keyword and the write tag data which are externally input at the time of retrieval keyword reading and at the time of tag data writing, respectively; and a matching detection control unit 14 that controls the comparison operation of tag array 13 and outputs the comparison result.

Tag array 13, the detailed configuration of which will be described later, can store an (m+1) number (m is a natural number) of tag data therein.

Matching detection control unit 14 outputs a retrieval result representing whether a tag data matching the input retrieval keyword is stored within tag array 13, and also outputs matching signals MT0–MTm for specifying the tag data matching the retrieval keyword.

Data storage unit 2 includes: a data array 23 that retains write data externally input; a data word control unit 21 that transmits the write data to data array 23; a data word line control unit 22 that activates a corresponding region within data array 23 in response to the write address externally input at the time of data writing and also in response to matching signals MT0–MTm output from keyword comparison unit 1 at the time of retrieval data reading; and a sense amplifier unit 24 that amplifies and outputs the data read out from data array 23 according to a designation of data word line control unit 22.

Each of tag array 13 and data array 23 has a plurality of memory elements arranged in rows and columns. The memory elements disposed in tag array 13 have comparison functions, as will be described later in detail. The configuration of data array 23 is identical to that of the memory cell array of a general random access memory (RAM).

Associative memory device 100 further receives a control signal indicating whether an access to the associative memory device 100 is for reading or writing, a clock signal for definition of the operation timing, and the like, which are not illustrated in FIG. 1 for purposes of simplicity.

The tag data (write tag) and the write data, which are related to each other by a write address, are stored in tag array 13 and data array 23, respectively.

Figure 2:
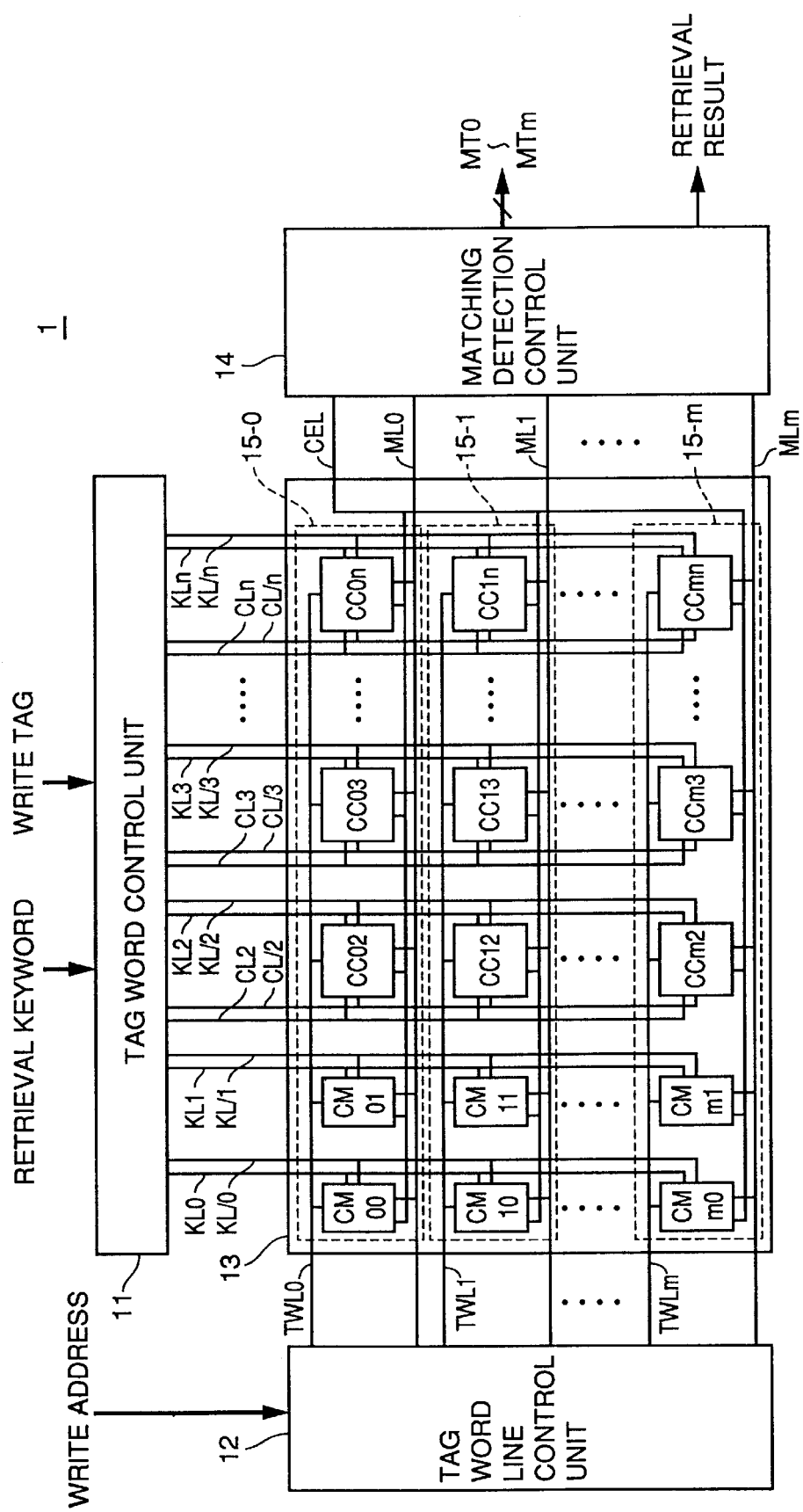
FIG. 2 is a block diagram illustrating a configuration of a keyword comparison unit 1.

Referring to FIG. 2, tag array 13 has a plurality of memory elements with comparison functions, which are arranged in (m+1) rows and (n+1) columns. As will be described later, the memory elements with comparison functions includes: a memory element (hereinafter, "CM cell") having a normal comparison function; and a memory element (hereinafter, "CC cell") having a comparison function capable of designating invalidation of a comparison result.

Figure 3:
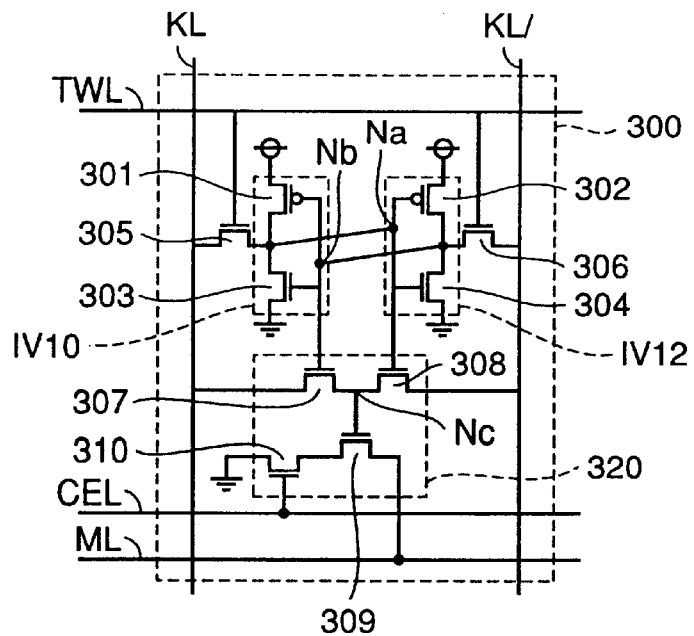
FIG. 3 is a circuit diagram showing a configuration of a CM cell.

Referring to FIG. 3, CM cell 300 is connected to a tag word line TWL, a matching signal line ML, a comparison operation control line CEL, and data signal lines KL, KL/. Transmitted on data signal lines KL and KL/ are signals complementary to each other.

CM cell 300 includes: transistors 301, 303 and transistors 302, 304 respectively constituting inverters IV 10 and IV 12, which form an inverter pair for latching data of nodes Na and Nb; write transistors 305 and 306 for writing data on data signal lines KL and KL/ to nodes Na and Nb, respectively; and a comparison circuit 320 for performing matching between data retained in node Na and data transmitted via data signal line Comparison circuit 320 includes: a transistor 307 having a gate connected to node Nb, and connected between data signal line KL and node Nc; a transistor 308 having a gate connected to node Na, and connected between node Nc and data signal line KL/; and transistors 309 and 310 connected in series between matching signal line ML and a ground node. The gates of transistors 309 and 310 are connected to node Nc and comparison operation control line CEL, respectively.

With such a configuration, in response to the activation (to an H level) of tag word line TWL, the data transmitted on data signal lines KL and KL/ are respectively transmitted to nodes Na and Nb via transistors 305 and 306, and retained in inverters IV 10 and IV 12.

In comparison circuit 320, transistors 307 and 308 connect either one of data signal lines KL and KL/ with node Nc, according to the data retained in inverter pair IV 10, IV 12. Thus, transistor 309 turns on when the data retained in node Na mismatches the data transmitted by data signal line KL. If transistor 310 turns on in response to the activation of comparison operation control line CEL, and transistor 309 turns on because of the mismatch between the data retained in node Na and the data transmitted on data signal line KL, then matching signal line ML is connected to the ground node.

Figure 4:
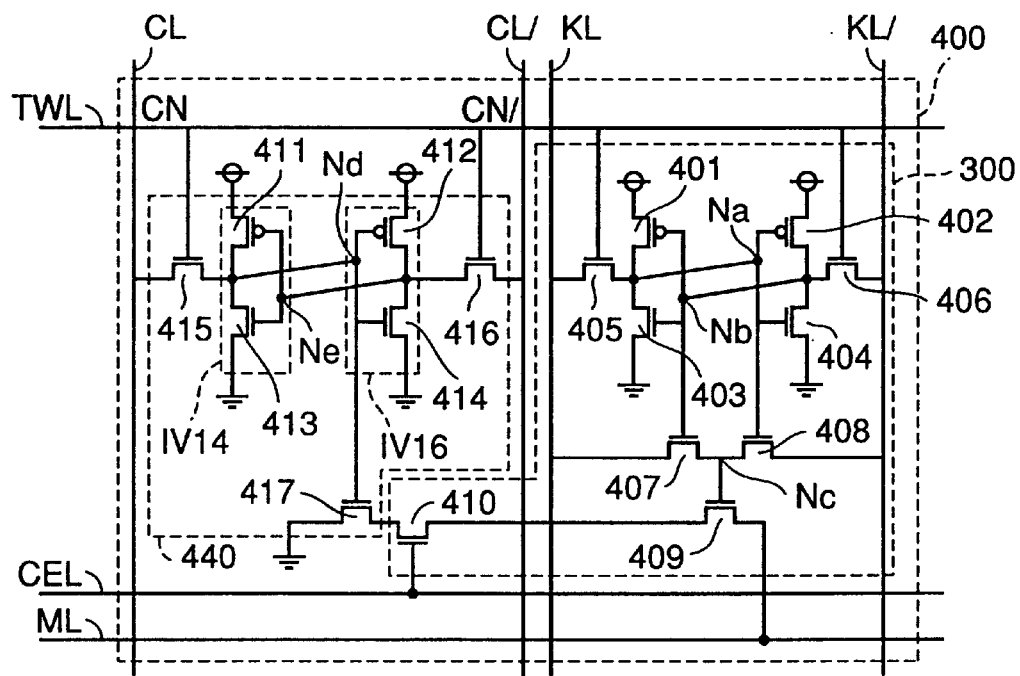
FIG. 4 is a circuit diagram showing a configuration of a CC cell.

Referring to FIG. 4, CC cell 400 is not only connected to tag word line TWL, comparison operation control line CEL, matching signal line ML and data signal lines KL, KL/, as is the CM cell, but also connected to comparison condition input lines CL, CL/. Comparison condition input lines CL and CL/ transmit a comparison condition signal CN and its inverted signal CN/, respectively.

Comparison condition signal CN is a signal that is provided from tag word control unit 11 at the time of tag data writing, a signal level of which is set as "true (at an H level)" in a bit in which the comparison operation between the retrieval keyword and the tag data is to be performed.

CC cell 400 includes: transistors 401–410 constituting a CM cell portion 300; and transistors 411–417 constituting a comparison result invalidation circuit 440. Transistors 401–409 are connected as in the case of the CM cell shown in FIG. 3, and thus, description thereof is not repeated. Transistor 410 is connected to a ground node via transistor 417 included in comparison result invalidation circuit 440.

Comparison result invalidation circuit 440 includes: write transistors 415 and 416 for transmitting the signal levels of comparison condition input lines CL and CL/ to nodes Nd and Ne; and transistors 411, 413 and transistors 412, 414 respectively constituting inverters IV 14 and IV 16 forming an inverter pair for retaining data of nodes Nd and Ne.

The gates of transistors 415 and 416 are connected to tag word line TWL. In response to the activation of tag word line TWL corresponding to the write address provided at the time of tag word writing, comparison condition signals CN, CN/ being transmitted by comparison condition input lines CL, CL/ are transmitted to and latched at nodes Nd and Ne, respectively.

Comparison result invalidation circuit 440 further includes transistor 417 that is turned on/off according to the potential level of node Nd. When the potential level of node Nd is at an H level, i.e., when comparison condition signal CN being latched is "true (at an H level)", transistor 417 is turned on. On the other hand, when the potential level of node Nd is at an L level, i.e., when comparison condition signal CN being latched is "false (at an L level)", transistor 417 is turned off.

With such a configuration, CC cell 400 connects matching signal line ML and the ground node only in the case where comparison operation control signal CE is activated, the signal levels of the data transmitted to data signal line KL and the data retained in node Na mismatch, and comparison condition signal CN being latched at node Nd is "true (at the H level)". In other words, when comparison condition signal CN being retained in node Nd is "false (at the L level)", matching signal line ML and the ground node are not connected regardless of the comparison result at the CM cell portion.

Referring again to FIG. 2, in the example shown in FIG. 2, the CM cells are disposed in the first and the second columns from the left side, and the CC cells are disposed in the remaining columns. Thus, according to the present embodiment, the comparison operation is effected at all times for the most significant two bits between the retrieval keyword and the stored tag data, while the comparison operation for the remaining bits in the tag data may be designated as necessary by comparison condition signal CN.

The memory elements with comparison functions which are included in the same row constitute respective one of matching circuits 15-0–15-m, which in turn corresponds to respective one of the plurality of tag data stored in tag array 13.

Tag word lines TWL0–TWLm and matching signal lines ML0–MLm are disposed corresponding to respective matching circuits 15-0–15-m, or corresponding to the respective rows of the memory elements with comparison functions.

Tag word line control unit 12 controls activation (to an H level) or inactivation (to an L level) of tag word lines TWL0–TWLm at the time of tag data writing operation, according to the write address. Specifically, a tag word line corresponding to the address for which the tag word writing is designated is activated by tag word line control unit 12.

The potential level of each of matching signal lines ML0–MLm is determined in response to the matching result between the retrieval keyword and the stored tag data at a corresponding matching circuit. In response to the potential levels of matching signal lines ML0–MLm, matching detection control unit 14 outputs matching detection signals MT0–MTm and a retrieval result.

Matching detection control unit 14 further outputs a comparison operation control signal CE for designating each memory element with comparison function to perform the comparison operation. Comparison operation control signal CE is transmitted by comparison control line CEL to every memory element with comparison function.

Data signal lines KL0–KLn and their complementary lines KL/0–KL/n are provided corresponding to respective columns of the memory elements with comparison functions. Further, a comparison condition input line is provided for every column in which the CC cells are disposed. In the example shown in FIG. 2, comparison condition input lines CL2–CLn and their complementary lines CL/2–CL/n are provided corresponding to all the columns except for the leftmost two columns having the CM cells arranged therein.

Tag word control unit 11 receives an externally supplied write tag at the time of data writing operation. The write tag includes: data of each bit of the tag data; and a comparison condition signal for designating validation/invalidation of a comparison operation at each bit of the tag data corresponding to the CC cell. The data of respective bits of the write tag are transmitted to tag array 13 via data signal lines KL0–KLn and KL/0–KL/n as well as via comparison condition input lines CL2–CLn and CL/2–CL/n, and stored in corresponding CC and CM cells.

Tag word control unit 11 receives an externally supplied retrieval keyword at the time of retrieval data reading operation. Data of respective bits of the retrieval keyword are transmitted to tag array 13 by data signal lines KL0, KL/0–KLn, KL/n, which are compared with the data of respective bits of the stored tag data at corresponding CC and CM cells.

Matching detection control unit 14 precharges all the matching signal lines ML0–MLm to a prescribed potential at the time of retrieval data reading operation. Thereafter, matching detection control unit 14 activates comparison operation control signal CE (to an H level) and designates start of the comparison operation. Each of the CC and CM cells performs matching between the data stored in itself and the data supplied to corresponding data signal line KL0–KLn and, if they mismatch, discharges the electric charges precharged on the corresponding matching signal line ML0–MLm to a ground node.

However, it should be noted that, in the CC cell, if the comparison condition signal retained therein is set as false (at the L level), the comparison result invalidation circuit works to prevent the discharge of the matching signal line, regardless of the comparison result.

Specifically, each of matching signal lines ML0–MLm retains the potential precharged in advance, only in the case where 1) the data in all the bits of the tag data stored in the CM and CC cells connected thereto completely match the data in the corresponding bits of the retrieval keyword transmitted by data signal lines KL0–KLn, or 2) every CC cell corresponding to the mismatching bit has comparison condition signal CN set as "false" and thus the comparison result thereof is invalidated.

Otherwise, i.e., of the CM and CC cells connected to one matching signal line, if mismatch is detected between corresponding bits of the stored tag data and the retrieval keyword in at least one of the CM cell(s) or the CC cell(s) having comparison condition signal(s) CN set as "true" and thus having the comparison result(s) not invalidated, the matching signal line is discharged.

At the end of the comparison operation, matching detection control unit 14 fully amplifies each potential level of matching signal lines ML0 MLm to output as matching detection signals MT0–MTm. When there exists a matching signal line remained undischarged, it means that there exists a tag data matching the input retrieval keyword. Correspondingly, the retrieval result is activated (to an H level).

Figure 5:
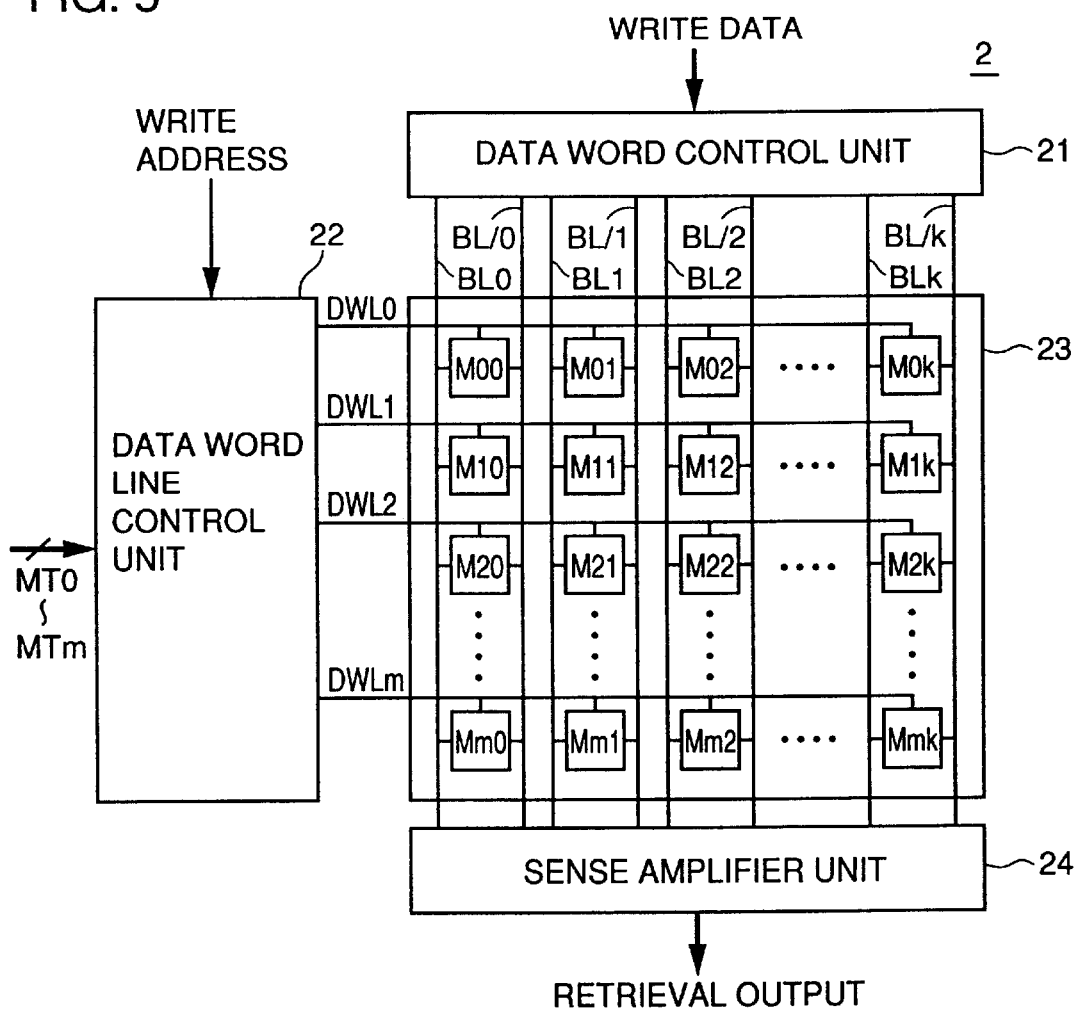
FIG. 5 is a block diagram showing a configuration of a data storage unit 2.

Referring to FIG. 5, data array 23 includes RAM cells M00–Mmk arranged in (m+1) rows and (k+1) columns. Data word lines DWL0–DWLm are provided corresponding to respective rows of the RAM cells, and bit lines BL0–BLk are provided corresponding to respective columns of the RAM cells. Bit lines BL0–BLk and bit lines BL/0–BL/k, which transmit signals complementary to each other, form bit line pairs, respectively.

Figure 6:
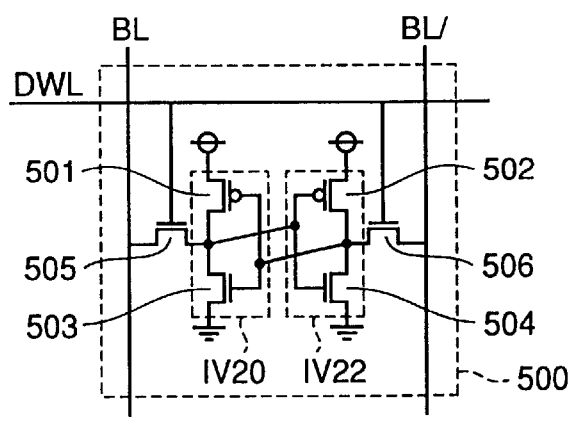
FIG. 6 is a circuit diagram showing a configuration of a RAM cell.

A configuration of an SRAM cell of a so-called C-MOS type is shown in FIG. 6 as an example of the configuration of the RAL cell.

Referring to FIG. 6, RAM cell 500 includes: write transistors 505 and 506 for taking in the data transmitted by bit line pair BL, BL/ in response to the activation of data word line DWL; and transistors 501, 503 and transistors 502, 504 respectively constituting inverters IV 20 and IV 22 for latching the data taken in. The operation of such an SRAM cell is well known, and thus, it is not described herein. In the present invention, any known circuit configuration of memory cells permitting random access may be applied as desired.

Referring again to FIG. 5, data word line control unit 22, at the time of data writing operation, selectively activates data word lines DWL0–DWLm (to an H level) according to the write address, so that respective bit values of the write data related to each tag data stored in tag array 13 are recorded into data array 23.

Data word line control unit 22, at the time of data reading operation, selectively activates data word lines DWL0–DWLm in response to matching detection signals MT0–MTm output from keyword comparison unit 1. In this case, the data are read out from the RAM cells connected to the activated data word line to the bit line pair, and sense amplifier unit 24 amplifies the data read out to the bit line pair.

Accordingly, when the keyword comparison units detects the presence of the tag data matching the input retrieval keyword, the data of (k+1) bits corresponding to the matched tag data is read out by sense amplifier unit 24 as the retrieval output.

Further, at the time of retrieval data reading, to prevent the decrease in the data reading speed and also to prevent accidental destruction of data retained in the RAM cell, it is necessary to precharge each bit line pair to an appropriate potential in advance. Data word control unit 21 performs such precharging operation at the time of retrieval data reading.

As described above, the operation of data storage unit 2 is similar to that in a normal memory device, except that data word lines DWL0–DWLm are selectively activated at the time of retrieval data reading, not based on the address signal externally input, but according to the matching detection result at keyword comparison unit 1.

As explained above, in the associative memory device according to the first embodiment, at the time of writing of each bit data of the tag data, it is possible to invalidate the comparison operation result between the corresponding bits of the tag data and of the retrieval keyword by an externally input signal. Thus, it becomes possible to arbitrarily designate, at a software level, the number of bits of the tag data to be compared with the retrieval keyword by an externally input signal. This makes the associative memory device efficiently applicable to the decoding of the variable-length codes, as will be described later in detail.

In a bit corresponding to the column in which CM cells are to be provided, the comparison result between the retrieval keyword and the tag data is always valid, as shown in FIG. 2. However, if it is unnecessary to provide a bit column that is always valid during the comparison operation, it is also possible to form all the memory elements within the tag array 13 with CC cells. As described in conjunction with FIGS. 3 and 4, however, the circuit scale of the CC cell is greater than that of the CM cell. Therefore, from the standpoint of the layout design, it is more advantageous to apply the CM cells to the column corresponding to a bit for which the matching is to be always conducted.

Second Embodiment

As described in the first embodiment, the configuration of the present invention allows, of the plurality of bits constituting the tag data, the remaining bits other than those corresponding to the CM cells to be divided into a plurality of bit groups, and a CC cell to be provided for each bit group. In the first embodiment, the case has been described in which each bit group consists of one bit, and a comparison condition input line CL is provided corresponding to each column of the CC cells, so that it is possible to designate the length of a keyword being compared in a unit of one bit.

In the second embodiment, another-case is described in which each bit group consists of a plurality of bits, or specifically, the length of the keyword for comparison can be designated with a lower precision in a unit of two bits, three bits or the like, so that the hardware scale can be restricted.

Figure 7:
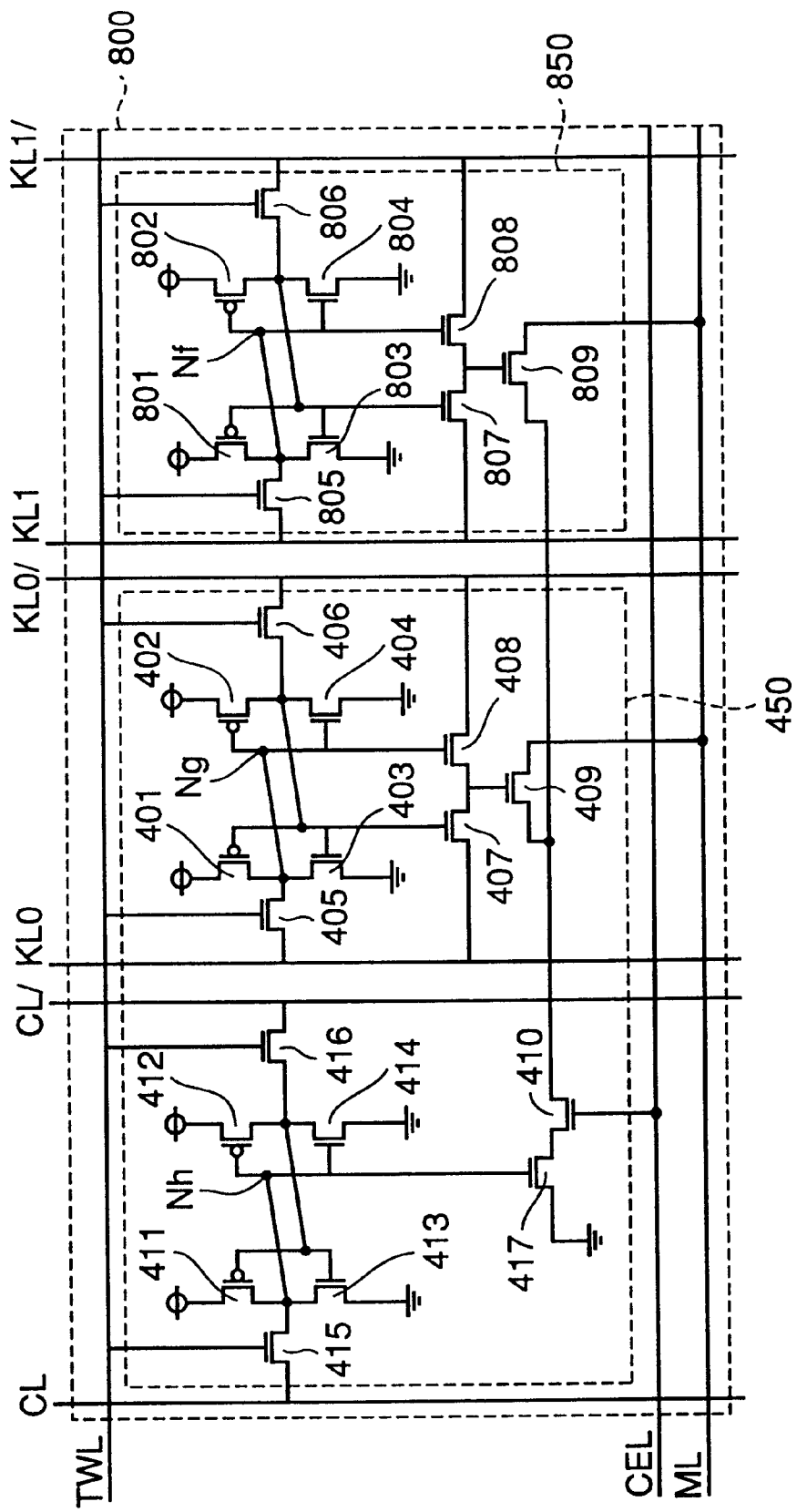
FIG. 7 is a circuit diagram showing a configuration of a CC cell 800 according to a second embodiment of the present invention.

Referring to FIG. 7, CC cell 800 according to the second embodiment has a comparison circuit 850 in addition to CC cell unit 450 according to the first embodiment.

CC cell unit 450, formed of transistors 401–417, has configuration and operation identical to those of FIG. 4, and thus, description thereof is not repeated.

Comparison circuit 850 has a configuration similar to that of the CM cell shown in FIG. 3. It performs matching between the data retained in node Nf and the data transmitted by data signal line KL1 and, when they mismatch, turns on a transistor 809.

CC cell unit 450 performs matching of the data retained in node Ng and the data transmitted by data signal line KL0 and, when they mismatch, turns on transistor 409.

Transistors 409 and 809 are connected in parallel with each other between transistor 410 and matching signal line ML. Therefore, in CC cell 800, when the data (of bits of the tag data) retained in nodes Ng and Nf match the data (of bits of the retrieval keyword) transmitted by data signal lines KL0 and KL1, respectively, both transistors 409 and 809 are turned off. However, if at least one of the above data set mismatches, a discharging path is formed between transistor 410 and matching signal line ML.

Transistors 410 and 417 within CC cell unit 450 are turned on/off according to the potential levels of comparison operation control line CEL and of node Nh retaining comparison condition signal CN, respectively.

Therefore, once matching signal line ML is precharged and comparison operation control line CEL designates execution of the comparison operation to CC cell 800, in order to prevent discharge of matching signal line ML so that it maintains the initial precharged level, transistor 417 should be in an off state, or, if transistor 417 is on, both transistors 409 and 809 should be off.

As a result, comparison condition signal CN retained in node Nh is also capable of invalidating the comparison result of comparison circuit 850. By driving comparison condition signal CN to "false (at an L level)", it is possible to invalidate the matching results of 2 bits corresponding to data signal lines KL0 and KL1.

Conversely, if the value of comparison condition signal CN is "true (at an H level)", in order to maintain matching signal line ML at the initial precharged level, it is necessary that both bits of the retrieval keyword corresponding to data signal lines KL0 and KL1 match the bits of tag data retained within CC cell 800.

With such a configuration, in the CC cell according to the second embodiment, it becomes possible to designate validation/invalidation of matching results between the retrieval keyword and the tag data in a unit of 2 bits.

Further, with the CC cell according to the second embodiment, it is possible to designate the keyword length in a unit of j bits (j is a natural number) greater than 2 bits. In this case, all that is needed is to add a circuit equivalent to comparison circuit 850 by a number corresponding to the value of j.

Modification of Second Embodiment

As the modification of the second embodiment, a configuration will be described in which the designation of keyword length for comparison is encoded by a comparison condition signal.

Figure 8:
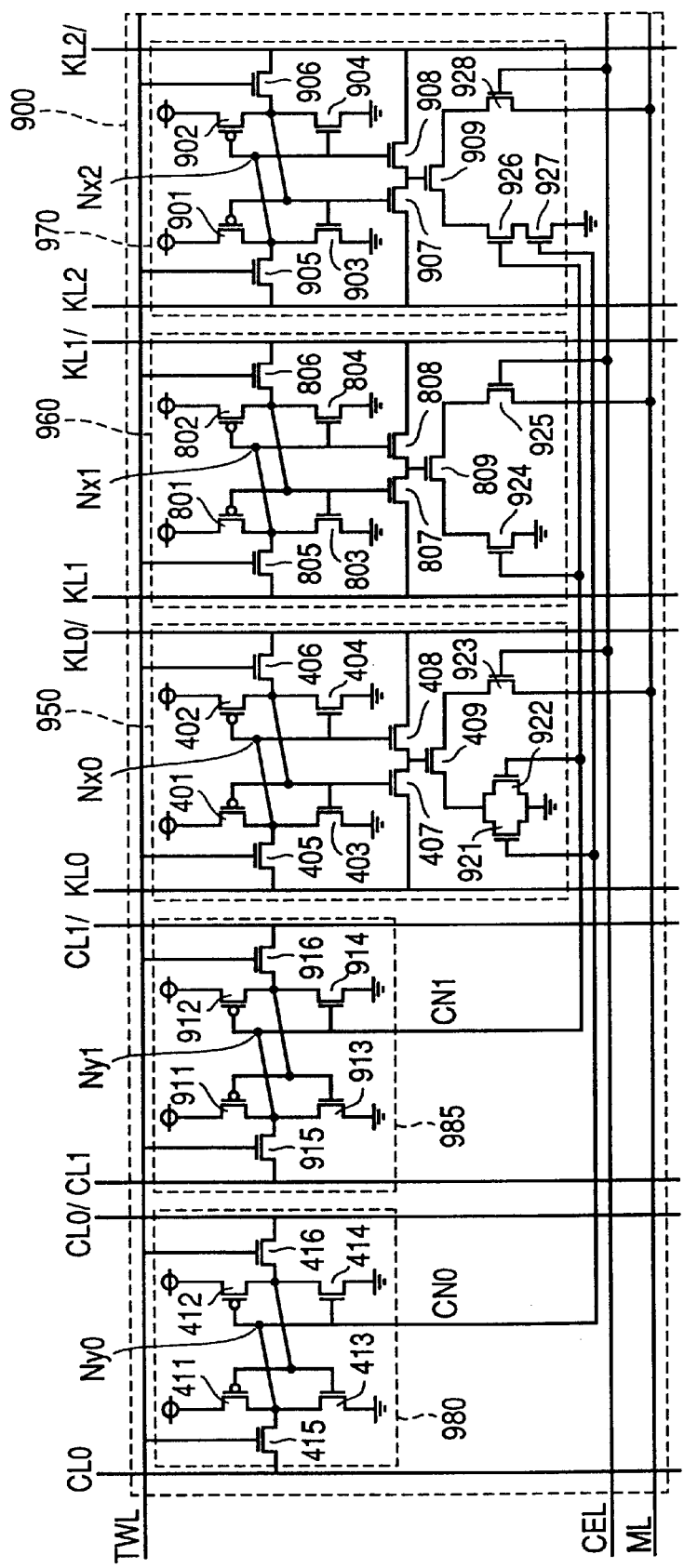
FIG. 8 is a circuit diagram showing a configuration of a CC cell 900 according to a modification of the second embodiment.

CC cell 900 in FIG. 8 shows, by way of example, the case where the comparison conditions for 3 bits of the retrieval keyword is being encoded by 2 bits of comparison condition signals CN0, CN1.

Referring to FIG. 8, CC cell 900 includes comparison circuits 950, 960 and 970, and comparison condition retaining circuits 980 and 985.

Comparison circuits 950, 960 and 970 are provided corresponding to data signal lines KL0, EL1 and KL2, respectively. Comparison condition retaining circuits 980 and 985 respond to activation of tag word line TWL and take in comparison condition signals CN0 and CN1 transmitted by comparison condition input lines CL0 and CL1, and retain the signals CN0 and CN1 in nodes Ny0 and Ny1, respectively. Whether the comparison results of comparison circuits 950, 960 and 970 are valid or invalid is determined according to the combination of the potential levels of nodes Ny0 and Ny1.

Now, the configurations of the comparison circuits will be described. Firstly, the configuration of comparison circuit 950 will be described representatively. Comparison circuit 950 includes: write transistors 405 and 406 for taking in data transmitted by data signal lines KL0 and KL0/ in response to activation of tag word line TWL; and transistors 401–404 constituting an inverter pair for retaining the data taken in by write transistors 405 and 406. The data of data signal line KL0 that was obtained in response to the activation of tag word line TWL is retained in node Nx0.

Comparison circuit 950 further includes transistors 407–409 for performing matching between the data retained in node Nx0 and the data transmitted to data signal line KL0. When the data match, transistor 409 is turned off; if they mismatch, transistor 409 is turned on.

Comparison circuit 950 further includes: transistors 921 and 922 connected between transistor 409 and a ground node, and turned on/off according to the potential levels of nodes Ny0 and Ny1, respectively; and a transistor 923 connecting/disconnecting transistor 409 and matching signal line ML according to the potential level of comparison operation control line CEL.

In comparison circuit 950 with such a configuration, when the potential level of comparison operation control line CEL changes to an H level and the comparison operation is designated, a path discharging the potential of matching signal line ML is created if the data of data signal line KL0 and the data retained in node Nx0 mismatch and either one of comparison condition signals CN0, CN1 is "true (at the H level)".

Comparison circuit 960 includes: transistors 801–809 having configurations identical to those of transistors 401–409 of comparison circuit 950; a transistor 924 having a gate connected to node Ny1, and connected between transistor 809 and a ground node; and a transistor 925 having a gate connected to comparison operation control line CEL, and connected between transistor 809 and matching signal line ML.

Comparison circuit 960 takes in the data of data signal line KL1 and retains the same in node Nx1 in response to activation of tag word line TWL. It can also perform, by transistors 807–809, matching between the data retained in node Nx1 and the data transmitted by data signal line KL1.

In comparison circuit 960 with such a configuration, when a comparison operation is designated by driving the potential level of comparison operation control line CEL to an H level, a path discharging the potential of matching signal line ML is created if the data retained in node Nx1 and the data of data signal line KL1 mismatch and comparison condition signal CN1 is "true (at the H level)".

Comparison circuit 970 has a similar configuration. Specifically, in response to the activation of tag word line TWL, it takes in data from data signal line KL2, and retains the data in node Nx2. Further, it performs matching between the data retained in node Nx2 and the data transmitted by data signal line KL2.

Comparison circuit 970 further includes: transistors 926 and 927 connected in series between transistor 909 and a ground node; and a transistor 928 connected between transistor 909 and matching signal line ML. The gates of transistors 926, 927 and 928 are connected with node Ny1, node Ny0 and comparison operation control line CEL, respectively. Thus, when comparison circuit 970 performs a comparison operation, a path discharging the potential of matching signal line ML is created if the data of data signal line KL2 and the data retained in node Nx mismatch and both comparison condition signals CN0 and CN1 are "true (at the H level)".

Therefore, by representing the signal levels of comparison condition signals CN0 and CN1 as (CN0, CN1), the validation/invalidation of the keyword comparison results of respective bits by comparison circuits 950–970 is designated as follows. If (0, 0), the keyword comparison results for 3 bits corresponding to data signal lines KL0–KL2 are all invalid. If (0, 1), only the keyword comparison result corresponding to the leftmost bit KL0 is valid. If (1, 0), the keyword comparison results for 2 bits from the left, corresponding to data signal lines KL0 and KL1, are valid. If (1, 1), the keyword comparison results for all the three bits corresponding to data signal lines KL0–KL2 are valid.

Thus, by the combination of 2 bits of comparison condition signals CN0 and CN1, it is possible to control validation/invalidation of a part or all of the keyword comparison results for 3 bits corresponding to data signal lines KL0–KL2.

In CC cell 900 shown in FIG. 8, it is impossible to designate validation/invalidation of the comparison result only for the bit in the middle of the three bits, i.e., the one corresponding to data signal line KL1.

However, it is unnecessary to designate only a bit in the middle of data as above in the case where such an associative memory is used for the decoding of variable-length codes, since, in this case, the keyword comparison is always performed for successive N bits (N is a natural number) from the higher bit side, as will be described later in detail.

In other words, by applying CC cell 900 according to the second embodiment to an associative memory device for use in decoding of variable-length codes, it becomes possible to efficiently designate the length of a keyword to be retrieved by encoding of a comparison condition signal.

FIG. 8 shows a case in which the keyword comparison results for 3 bits are validated/invalidated according to the comparison condition signals of 2 bits. In the same manner, it is possible to designate the keyword comparison conditions for $2^I-1$ bits (I is a natural number) by the comparison condition signals of I bits. For example, it is possible to encode the keyword comparison conditions for 7 bits with the comparison condition signals of 3 bits, or, the conditions for 15 bits with the signals of 4 bits.

Third Embodiment

In the third embodiment, decoding of variable-length codes using the associative memory device as in the first and second embodiments will be described.

Assume that decoding according to a variable-length coding system as shown in FIG. 9 is being performed using associative memory device 100 explained in the first embodiment.

Here, to determine the size of the associative memory device, natural numbers n, m and k are assumed to be 8, 15 and 15, respectively, in FIGS. 2 and 5.

Referring to FIG. 9, in the variable-length coding system described herein, eight pieces of data "0"–"7" are coded to variable-length codes each having a code length of either 1, 2, 4 or 6.

Now, data to be stored in associative memory device 100 for the decoding according to the variable-length coding system as shown in FIG. 9 will be described.

In FIG. 10, binary numerals are used to express the data in the write tag, and hexadecimal notation is used to express the other data. "?" shows that any value can be written therein.

Referring to FIG. 10, write tags being written into the keyword comparison unit and the contents of write data being written into the data storage unit are determined corresponding to write addresses.

The most significant bit of the tag data is provided to indicate whether the corresponding write address stores therein any data to be used for the decoding. Specifically, only the tag data corresponding to the address having tag information effective for the decoding therein has the value "1" set at a bit corresponding to data signal line KL0. On the other hand, upon reading of the retrieval data, or upon the decoding, the retrieval keyword is provided such that "1" is input into data signal line KL0. Thus, it becomes possible to prevent erroneous matching detection due to the invalid tag information accidentally present within the keyword comparison unit.

To be written into the second highest bit and the following bits of the tag data are the data corresponding to the variable-length codes shown in FIG. 9, which are filled in from the higher bit side, or from the left side, in sequence. These bits of data are respectively written by data signal lines KL1–KL8.

In the bits corresponding to data signal lines KL2–KL8, any value can be written into the bits having "?" set therein. They can be excluded from a comparison target by setting corresponding comparison condition signals to "false (at an L level)" by comparison condition input lines CL2–CL8, so that a proper keyword retrieval can be conducted.

Recorded in the data storage unit are the decoded data corresponding to the variable-length codes and their code lengths, which are related to the variable-length codes stored within the keyword comparison unit as the tag data, by the writing addresses.

Hereinafter, the decoding of the variable-length code as explained above will be described using the following example:

"1101_0010_1111_1111 . . ."

Figures 11, 12:
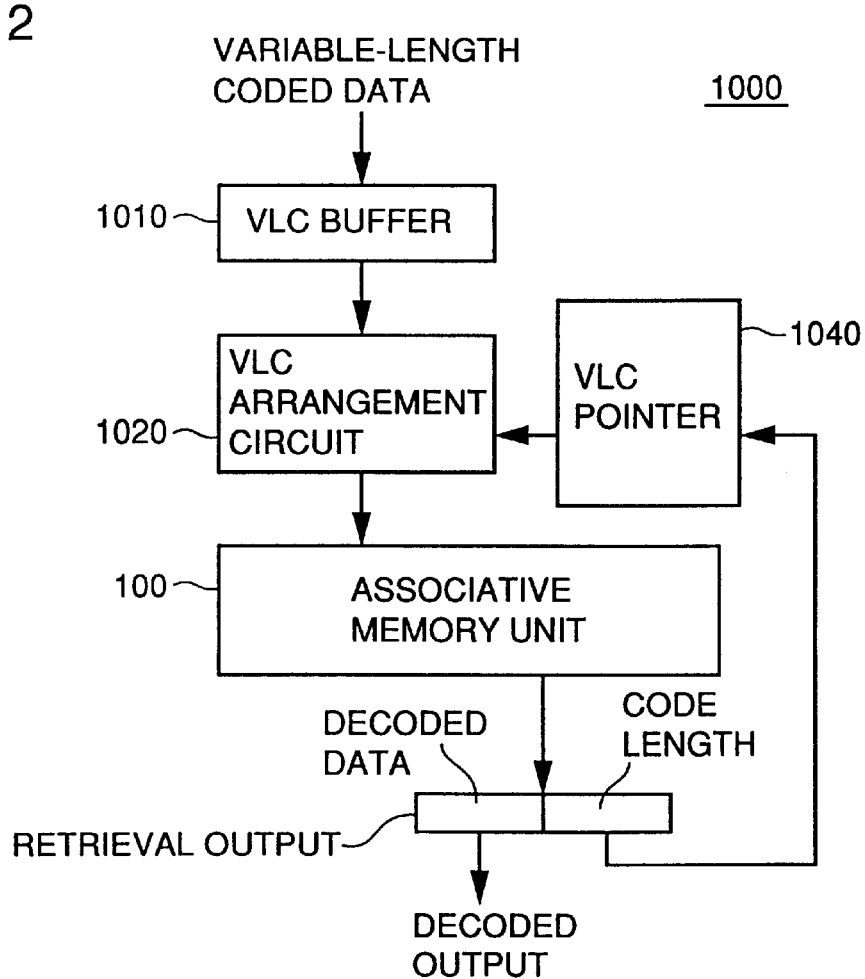
FIG. 11 illustrates decoding of the variable-length code data being performed based on the data stored in associative memory device 100 according to FIG. 10.
FIG. 12 is a schematic block diagram illustrating a variable-length code decoding device 1000 according to a third embodiment of the present invention.

At this time, retrieval keywords given to associative memory device 100 for the first through fifth decoding, and decoded data and their code lengths obtained as the retrieval output are as shown in FIG. 11.

Referring to FIG. 11, as the first retrieval keyword for the first decoding, a signal of 9 bits "1_1101_0010" is input, which includes one bit indicating that the decoding of the variable-length code is being executed, and the leading 8 bits of the variable-length code.

In response to the input of such a retrieval keyword, matching is detected at an address "3" between the retrieval keyword and the tag data stored. Thus, the decoded data "3" and the code length "4" corresponding to the address "3" are output. The retrieval result being output from the matching detection control unit is activated (to an "H" level).

The retrieval keyword for the second decoding is formed by removing the leading 4 bits from the variable-length code, corresponding to the code length obtained by the first decoding. The target for the decoding this time is the next 8 bits, with the fifth bit as its leading bit. Thus, for the second decoding, the retrieval keyword "1_0010_1111" is provided.

In this case, matching is detected at the address "0" between the retrieval keyword and the tag data. Thus, the decoded data "0" and code length "1" are obtained.

The third and fourth decoding is conducted in the same manner. In the fifth decoding, the retrieval keyword "1_1111_1111" is provided.

As shown in FIG. 10, associative memory device 100 does not have tag information matching such a keyword. Therefore, the retrieval result is not activated. Thus, from the outside of the associative memory device, it is possible to detect that the provided variable-length code cannot be decoded according to the fact that the retrieval result is not activated. This permits a countermeasure to be taken for avoidance of an error.

Now, an entire configuration of a variable-length code decoding device according to the third embodiment will be described.

Referring to FIG. 12, the variable length code decoding device 1000 includes: a variable-length code (VLC) buffer 1010 that temporarily stores externally supplied variable-length code data; a VLC arrangement circuit 1020 that responds to a designation from a VLC pointer 1040 to provide an associative memory unit 100 with bits of the variable-length code data being decoded as a retrieval keyword; associative memory unit 100; and a VLC pointer 1040 that designates a leading bit of the variable-length code data being decoded according to a code length output from associative memory unit 100.

VLC buffer 1010 receives externally supplied variable-length coded data, and, when the number of bits of data stored therein falls short of a fixed amount, refills new variable-length code data from the outside.

VLC pointer 1040 designates where the variable-length code data being decoded is stored within VLC buffer 1010, by pointing a location of its leading bit. VLC pointer 1040 responds to a decoded result corresponding to one input of the retrieval keyword, and updates its own value based on the code length data output from associative memory unit 100.

VLC arrangement circuit 1020 responds to the designation from VLC pointer 1040, and takes out of VLC buffer 1010 a fixed number of bits of the variable-length code data being decoded from the left side in sequence. It further extends the data for one bit by setting "1" at the leftmost thereof (as the most significant bit). VLC arrangement circuit 1020 then provides the resulting data being decoded to associative memory unit 100.

The data being output from associative memory unit 100 include decoded data and their code lengths, as shown in FIG. 10. The code lengths are provided to VLC pointer 1040, while the decoded data are output to the outside.

With such a configuration, variable-length code decoding device 1000 is capable of decoding variable-length coded data, as shown in FIGS. 9 to 11.

In FIG. 12, a data writing path for associative memory unit 100 is not shown for purposes of simplicity. All that is needed is to input the write tags and the write data prior to the decoding, as shown in FIG. 10.

Further, variable-length code decoding device 1000 as shown in FIG. 12 may be configured, instead of using a dedicated hardware, by combining a microprocessor and an associative memory device, to perform decoding of the variable-length data in the same manner as described above.

In the case where the variable-length coding system as described in conjunction with FIGS. 9 and 10 is utilized, it is possible to designate validation/invalidation of the comparison results for the bits corresponding to KL3 and the following in a unit of 2 bits. Therefore, CC cell 800 of FIG. 7 according to the second embodiment can be used as the memory elements with comparison functions in the columns corresponding to data signal lines KL3–KL8. This allows the designation the same as that provided by comparison condition input lines CL2–CL8 to be realized with a fewer number of interconnection lines. This also suppresses layout area of the memory elements.

Moreover, in the case where the validation/invalidation of the keyword comparison results can be designated in units of more than 2 bits dependent on a variable-length coding system being utilized, it is possible to configure the variable-length code decoding device with associative memory device 100 incorporating CC cells 800 and/or 900 as in FIGS. 7 and 8.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An associative memory device outputting data according to an input of retrieval data having a plurality of bits, comprising:

a keyword comparison array retaining a plurality of tag data each having a plurality of bits and performing matching between said retrieval data input and each of said plurality of tag data, said keyword comparison array including a plurality of matching circuits provided corresponding to said plurality of tag data, each for comparing said retrieval data and corresponding one of said plurality of tag data, each of said plurality of matching circuits having n (n is an integer at least 0) first comparison memory units provided corresponding to n bits of said corresponding tag data, each retaining corresponding one of said n bits and performing a matching operation between the retaining bit and a corresponding bit of said retrieval data, and m (m is a natural number) second comparison memory units provided corresponding to a plurality of parts each including at least one bit of remaining bits of said corresponding tag data other than said n bits, each performing said matching operation between the at least one bit of corresponding one of said plurality of parts of the remaining bits and corresponding at least one bit of said retrieval data, a matching result of which being invalidated dependent on an externally set comparison condition signal, said keyword comparison array further including a plurality of matching detection signal lines provided corresponding to said plurality of matching circuits, each of said plurality of matching detection signal lines having a potential level determined according to the matching results of said n first comparison memory units and the matching results of (m−k) (k is an integer from 0 to m) out of said m second comparison units other than the k units having said comparison results invalidated, included in corresponding said matching circuit; and a data storage array responsive to the potential level of each of said plurality of matching detection signal lines for outputting data corresponding to one of said plurality of tag data that matches said retrieval data.

2. The associative memory device according to claim 1, wherein said keyword comparison array further includes a matching control unit for controlling said matching operation, said matching control unit precharging said plurality of matching detection signal lines to a first potential prior to said matching operation and then designating said matching operation to each of said first and second comparison memory units, each of said first comparison memory units, upon said matching operation, couples corresponding said matching detection signal line to a power supply node supplying a second potential that is lower than said first potential in the case where data levels of corresponding bits of said retrieval data and said corresponding tag data mismatch, and each of said second comparison memory units, upon said matching operation, couples corresponding said matching detection signal line to said power supply node in the case where invalidation of said matching result by said comparison condition signal is prevented and signal levels of corresponding bits of said retrieval data and said corresponding tag data mismatch.

3. The associative memory device according to claim 2, wherein said remaining bits are divided into a number of bit groups each having one bit, the number of bit groups corresponding to the number of said m, and said m second comparison memory units are provided corresponding to said bit groups, each of said first comparison memory units including a first memory circuit for retaining corresponding one bit of said corresponding tag data, and first and second switching circuits connected in series between corresponding said matching detection signal line and said power supply node, said first switching circuit turning on when said matching operation is designated by said matching control unit, and said second switching circuit turning on when data levels of the bit retained in said first memory circuit and a corresponding bit of said retrieval data mismatch, each of said second comparison memory units including, in addition to a configuration the same as each of said first comparison memory units, a second memory circuit for retaining said comparison condition signal, and a third switching circuit connected in series with said first and second switching circuits and turned off when said matching result is invalidated by said comparison condition signal.

4. The associative memory device according to claim 2, wherein said remaining bits are divided into a number of bit groups each having i bits (i is a natural number greater than 1), the number of bit groups corresponding to the number of said m, and said m second comparison memory units are provided corresponding to said bit groups, each of said second comparison memory units including i first memory circuits for retaining corresponding i bits of said corresponding tag data, respectively, a second memory circuit for retaining said comparison condition signal, a first switching circuit turning on when said matching operation is designated by said matching control unit, i second switching circuits provided corresponding to said i first memory circuits, each turning on when data levels of the bit retained in corresponding said first memory circuit and a corresponding bit of said retrieval data mismatch, and a third switching circuit turned off when said matching result is invalidated by said comparison condition signal, said first and third switching circuits being connected in series with each other and connected in series with said power supply node, and said i second switching circuits being connected in parallel between said first and third switching circuits and corresponding said matching detection signal line.

5. The associative memory device according to claim 2, wherein
said remaining bits are divided into a number of bit groups each having i bits (i is a natural number greater than 2), the number of bit groups corresponding to the number of said m,
said m second comparison memory units are provided corresponding to said bit groups, and
said comparison condition signal has j bits (j is a natural number greater than 1),
each of said second comparison memory units including
a comparison condition retaining circuit for retaining the j bits of said comparison condition signal, and
first to i-th data comparison circuits corresponding to said i bits of corresponding said bit group,
each of said data comparison circuits including
a first memory circuit for retaining corresponding one bit of said i bits,
a first switching circuit turning on when said matching operation is designated by said matching control unit,
a second switching circuit turning on when data levels of the bit retained in said first memory circuit and a corresponding bit of said retrieval data mismatch, and
a third switching circuit connected in series with said first and said second switching circuits between said matching signal line and said power supply node,
said third switching circuit in each of said data comparison circuits being turned on/off according to a combination of the j bits of said comparison condition signal.

6. The associative memory device according to claim 5, wherein said third switching circuit is turned on in the first to L-th data comparison circuits (L is an integer at most i), among said first to i-th data comparison circuits, according to the combination of the j bits of said comparison condition signal.

7. The associative memory device according to claim 5, wherein a relation between the number of bits j of said comparison condition signal and the number of bits i included in each of said bit groups is expressed as: $i=2^j-1$.

8. The associative memory device according to claim 2, wherein said matching control unit responds to a potential level of each of said plurality of matching detection signal lines and outputs a retrieval result indicating whether there exists said tag data that matches said retrieval data input.

9. The associative memory device according to claim 1, wherein said plurality of tag data and said comparison condition signal are input in advance from the outside of said associative memory device.

10. A variable-length code decoding device for decoding variable-length code data, comprising:
a retrieval data setting circuit receiving a bit stream of the variable-length code data input as a decoding target, and outputting retrieval data including a fixed number of bits being decoded in one decoding process;
an associative memory circuit responsive to input of said retrieval data for outputting decoded data corresponding to said variable-length code data and code length data indicating the number of bits of said decoded data, said associative memory circuit including
a keyword comparison array retaining coded said variable-length code data as a plurality of tag data and performing a matching operation between said retrieval data input and each of said plurality of tag data,
said keyword comparison array including a plurality of matching circuits provided corresponding to said plurality of tag data, each comparing said retrieval data and corresponding one of said plurality of tag data,
each of said plurality of matching circuits having m (m is a natural number) first comparison memory units provided corresponding to a plurality of parts each including at least one bit of corresponding said tag data,
each of said first comparison memory units retaining the at least one bit of corresponding one of said plurality of parts of said tag data and a comparison condition signal externally supplied in advance, for performing a matching operation between the retaining at least one bit and corresponding at least one bit of said retrieval data, a matching result of which being invalidated dependent on said comparison condition signal,
said keyword comparison array further including a plurality of matching detection signal lines provided corresponding to said plurality of matching circuits,
each of said plurality of matching detection signal lines having a potential level determined according to said matching results of (m−k) (k is an integer between 0 and m) out of said m first comparison memory units other than the k units having said matching results invalidated, included in corresponding said matching circuit, and
said associative memory circuit further including a data storage array responsive to the potential level of each of said plurality of matching detection signal lines for outputting said decoded data and said code length data associated wit h said variable-length code data corresponding to one of said plurality of tag data; and
a decoding target pointer circuit responsive to said code length data for designating to said retrieval data setting circuit a leading bit of the fixed number of bits, of the bit stream of said variable-length code data input, to be decoded in a next decoding process.

11. The variable-length code decoding device according to claim 10, wherein
said matching result is invalidated in any of said m first comparison memory units included in each said matching circuit, that retains no data corresponding to said variable-length code data.

12. The variable-length code decoding device according to claim 10, wherein
said keyword comparison array further includes a matching control unit for controlling said matching operation,
said matching control unit precharging said plurality of matching detection signal lines to a first potential prior to said matching operation and then designating said matching operation to each of said first comparison memory units, and
each of said first comparison memory units, when said matching operation is designated, couples corresponding said matching detection signal line to a power supply node supplying a second potential that is lower than said first potential in the case where invalidation of said matching result by said comparison condition signal is prevented and data levels of corresponding bits of said retrieval data and said corresponding tag data mismatch.

13. The variable-length code decoding device according to claim 12, wherein said tag data is divided into a number of bit groups each having one bit, the number of bit groups corresponding to the number of said m, and said m first comparison memory units are provided corresponding to said bit groups, each of said first comparison memory units including a first memory circuit for retaining corresponding one bit of said corresponding tag data, a second memory circuit for retaining said comparison condition signal, first and second switching circuits connected in series between corresponding said matching detection signal line and said power supply node, said first switching circuit turning on when said matching operation is designated by said matching control unit, and said second switching circuit turning on when data levels of the bit retained in said first memory circuit and a corresponding bit of said retrieval data mismatch, and a third switching circuit connected in series with said first and second switching circuits and turned off when said matching result is invalidated by said comparison condition signal.

14. The variable-length code decoding device according to claim 12, wherein said tag data is divided into a number of bit groups each having i bits (i is a natural number greater than 1), the number of bit groups corresponding to the number of said m, and said m first comparison memory units are provided corresponding to said bit groups, each of said first comparison memory units including i first memory circuits for retaining corresponding i bits of said corresponding tag data, respectively, a second memory circuit for retaining said comparison condition signal, a first switching circuit turning on when said matching operation is designated by said matching control unit, i second switching circuits provided corresponding to said i first memory circuits, each turning on when data levels of the bit retained in corresponding said first memory circuit and a corresponding bit of said retrieval data mismatch, and a third switching circuit turned off when said matching result is invalidated by said comparison condition signal, said first and third switching circuits being connected in series with each other and connected in series with said power supply node, and said i second switching circuits being connected in parallel between said first and third switching circuits and corresponding said matching detection signal line.

15. The variable-length code decoding device according to claim 12, said tag data is divided into a number of bit groups each having i bits (i is a natural number greater than 2), the number of bit groups corresponding to the number of said m, said m first comparison memory units are provided corresponding to said bit groups, and said comparison condition signal has j bits (j is a natural number greater than 1), each of said first comparison memory units including a comparison condition retaining circuit for retaining the j bits of said comparison condition signal, and first to i-th data comparison circuits corresponding to said i bits of corresponding said bit group, each of said data comparison circuits including a first memory circuit for retaining corresponding one bit of said i bits, a first switching circuit turning on when said matching operation is designated by said matching control unit, a second switching circuit turning on when data levels of the bit retained in said first memory circuit and a corresponding bit of said retrieval data mismatch, and a third switching circuit connected in series with said first and said second switching circuits between said matching signal line and said power supply node, said third switching circuit in each of said data comparison circuits being turned on/off according to a combination of the j bits of said comparison condition signal.

16. The variable-length code decoding device according to claim 15, wherein said third switching circuit is turned on in the first to L-th data comparison circuits (L is an integer at most i), among said first to i-th data comparison circuits, according to the combination of the j bits of said comparison condition signal.

17. The variable-length code decoding device according to claim 10, wherein said retrieval data includes a decode execution bit that is set to a prescribed level when a decoding process is being executed, each of said plurality of matching circuits further includes a second comparison memory unit performing said matching operation between a signal level retained therein in advance and the level of said decode execution bit, said keyword comparison array further includes a matching control unit for controlling said matching operation, said matching control unit precharging said plurality of matching detection signal lines to a first potential prior to said matching operation, and then designating said matching operation to each of said first and second comparison memory units, each of said first comparison memory units, upon said matching operation, couples corresponding said matching detection signal line to a power supply node supplying a second potential that is lower than said first potential in the case where invalidation of a result of said matching operation by said comparison condition signal is prevented and corresponding bits between said retrieval data and said corresponding tag data mismatch, and said second comparison memory unit retains said prescribed level therein in advance when corresponding one of said matching circuits retains said variable-length code data, and couples, upon said matching operation, corresponding said matching detection signal line to said power supply node in the case where the level of said decode execution bit and said signal level retained therein in advance mismatch.

18. The variable-length code decoding device according to claim 10, wherein said matching control unit outputs a retrieval result indicating whether there exists said tag data matching said retrieval data input, according to the potential level of each of said plurality of matching detection signal lines.

19. A variable-length code decoding device for decoding variable-length code data, comprising:

a retrieval data setting circuit receiving a bit stream of the variable-length code data input as a decoding target, and outputting retrieval data including a fixed number of bits being decoded in one decoding process;

an associative memory circuit responsive to input of said retrieval data for outputting decoded data corresponding to said variable-length code data and code length data indicating the number of bits of said decoded data, said associative memory circuit including a keyword comparison array retaining coded said variable-length code data as a plurality of tag data and performing a matching operation between said retrieval data input and each of said plurality of tag data, said keyword comparison array including a plurality of matching circuits provided corresponding to said plurality of tag data, each for comparing said retrieval data and corresponding one of said plurality of tag data, each of said plurality of matching circuits having n (n is an integer at least 0) first comparison memory units provided corresponding to n bits of said corresponding tag data, each retaining corresponding one of said n bits and performing a matching operation between the retaining bit and a corresponding bit of said retrieval data, and m (m is a natural number) second comparison memory units provided corresponding to a plurality of parts each including at least one bit of remaining bits of said corresponding tag data other than said n bits, each performing said matching operation between the at least one bit of corresponding one of said plurality of parts of the remaining bits and corresponding at least one bit of said retrieval data, a matching result of which being invalidated dependent on an externally set comparison condition signal, said keyword comparison array further including a plurality of matching detection signal lines provided corresponding to said plurality of matching circuits, each of said plurality of matching detection signal lines having a potential level determined according to the matching results of said n first comparison memory units and the matching results of (m−k) (k is an integer from 0 to m) out of said m second comparison units other than the k units having said comparison results invalidated, included in corresponding said matching circuit, said associative memory circuit further including a data storage array responsive to the potential level of each of said plurality of matching detection signal lines for outputting said decoded data and said code length data associated with said variable-length code data corresponding to one of said plurality of tag data; and a decoding target pointer circuit responsive to said code length data for designating to said retrieval data setting circuit a leading bit of the fixed number of bits, of the bit stream of said variable-length code data input, to be decoded in a next decoding process.

\* \* \* \* \*